United States Patent [19]

Tota

[11] Patent Number: 5,781,067
[45] Date of Patent: Jul. 14, 1998

[54] ELECTRONIC INDUCTIVE SWITCHING POWER AMPLIFIER

[76] Inventor: Tasleem Tota, 213A Clarke Road, Penal, Trinidad, St. Kitts/Nevis

[21] Appl. No.: 638,136

[22] Filed: Apr. 26, 1996

[51] Int. Cl.$^6$ .................................................. H03F 3/38
[52] U.S. Cl. ................................................................ 330/10
[58] Field of Search ........................... 330/10, 146, 207 A, 330/251

[56] References Cited

U.S. PATENT DOCUMENTS

| | | |
|---|---|---|
| 3,829,788 | 8/1974 | Ford ............................................ 330/10 |
| 4,016,501 | 4/1977 | Jasinski et al. ............................. 330/10 |
| 5,510,753 | 4/1996 | French ..................................... 330/10 X |

FOREIGN PATENT DOCUMENTS 56011   5/1981   Japan ..................................... 330/10

*Primary Examiner*—James B. Mullins
*Attorney, Agent, or Firm*—Nancy E. Hill; Hill & Schumacher

[57] ABSTRACT

An electronic inductive switching power amplifier designed for but not limited to amplification of electrical audio signals consists of a power conversion system, a signal control system together with a direct current power source wherein the power conversion system comprising of a pulse width modulator circuit, primary semiconductor switches and a high frequency switching transformer wherein the direct current power source is pulse width modulated through primary winding on the switching transformer by the primary semiconductor switches being controlled by the pulse width modulator. The switching transformer further comprises of a secondary winding wherein the primary to secondary winding ratio effects the required power conversion and amplification. The signal control system comprising of a multifunction preamplifier, an output driver circuit, a full wave rectifier, output semiconductor switches and a low pass electronic filter wherein the electrical audio input signal to be amplified is applied to the multifunction preamplifier thereafter producing two output signals one being an absolute value signal controlling the pulse width modulator and the second signal which is a square wave switching signal at the same frequency and phase as the input signal controlling the output driver circuit thereby producing complimentary switching signals further controlling the output semiconductor switches. The pulse width modulated output signal from the secondary winding on the switching transformer passes through the full wave rectifier and thereafter being alternately switched through the low pass filter whereby the original input waveform is reconstructed but at a greatly increased power level.

15 Claims, 1 Drawing Sheet

ELECTRONIC INDUCTIVE SWITCHING POWER AMPLIFIER

BACKGROUND OF THE INVENTION

1. Field of the Invention

This invention relates to an electronic inductive switching power amplifier which receives power directly from a primary power source such as 12 or 24 volts, Direct current (DC) or 115 volts Alternating current (AC) rectified and filtered, whereby this primary power source is directly pulse width modulated by a low power AC or DC input signal operating a pulse width modulator through a high frequency switching transformer whose primary to secondary winding ratio effects the required power conversion and amplification and whose output is rectified and filtered and alternately switched across the required load whereby the original input signal is reconstructed at a greatly increased power level.

2. Description of the Prior Art

The subject matter of this invention relates to an electronic inductive switching power amplifier which utilises power supplied by a primary power source. This primary source of power generally includes but not limited to 12 or 24 volts, Direct current (DC) from Automobile batteries or 160 volts direct current derived from 115 volts Alternating current (AC) main supply. Power conversion and amplification is achieved by high frequency pulse width modulation of this power source through a high frequency switching transformer. The primary to secondary winding ratio of this transformer effects the required power conversion and amplification.

Presently most electronic audio power amplifiers utilise a primary power source, a secondary power source and a separate electronic amplifier module for power conversion and amplification. These systems can be very inefficient, dissipate large amounts of heat, waste power attract high component count and can be very bulky. Secondary power sources are usually dual voltages such as plus and minus 50 volts DC derived from either a primary power source such as 12 or 24 volts DC from automobile batteries or from 115/240 volts AC main supply.

In the case where a primary source of 12 or 24 volts DC is utilised, an elaborate power converter is used to generate a secondary power source such as a plus and a minus 50 volts DC. These power convertors can sometimes inherently dissipate high power levels causing excessive heat to be generated discharging batteries prematurely.

Amplifiers utilising main supply 115/240 volts AC 60/50 Hertz usually generate a secondary source by the use of large bulky mains transformers or elaborate switching power convertors and sometimes additional linear voltage regulators are used.

Line or switching amplifier are subsequently used for power amplification. Linear amplifiers and linear voltage regulators operate similar to variable resistors and control power by varying its effective resistance.

Accordingly large power dissipation and heat dissipation is effected which can lead to power wastage, thermal problems and subsequent component failure.

To adequately dissipate large power and high heat levels, high power semiconductors are required with large heat sinks. Dual conversion systems for power amplification which use a secondary power source and separate amplifier functions similar to an elaborate dual series power regulator whereby power is taken from the primary power source passing through and being converted to a secondary power source and modulated through a power amplifier.

This technique can be inherently inefficient, dissipate excessive heat, waste power, attract high component and count can be very bulky. Manufacture of electronic components can be very costly and with multifunction power drive systems in industry, high density packaging is necessary.

Accordingly, there is obvious need in the electrical and electronic industries for more efficient power drive systems. Miniaturization and heat reduction is imperative. There is a further need to reduce component count and cost of power amplifiers especially or audio application and general consumer use.

SUMMARY OF THE INVENTION

The present invention is directed towards an electronic inductive switching power amplifier specifically designed to utilise only a primary power source whereby high frequency pulse width modulation of this power source through a high frequency switching transformer effects power amplification which can be of particular use but not limited to the audio industry.

The present invention includes a pulse width modulator circuitry operating high frequency primary semiconductor switches, switching power from primary source through primary winding of the said high frequency transformer. Power amplification is effected by means of primary to secondary winding ratio on said transformer and output power is taken off the secondary winding hereafter being rectified, filtered and synchronized with the input signal by the use of output semiconductor switches.

The present invention includes a multifunction preamplifier whose function is to compute negative feedback and to convert the input signal, which may be AC. or DC. to a signal suitable for operating the pulse width modulator through an electronic signal isolator. This signal isolator can be but not limited to a signal transformer or an optical isolator and whose function is to isolate AC main supply from input and output circuitry.

It should be noted however that this isolator is not necessary when the amplifier is powered from an isolated DC source such as an automobile battery.

The said multifunction preamplifier also produces a switching output signal at the same frequency and phase as the input signal and which is used to operate the aforementioned output semiconductor switches so as to synchronize the output waveform with the input waveform through an output driver circuitry.

The present invention includes semiconductor output switches whose function is to select the respective output waveform through a low pass filter to a power take off point thence to an electrical load which may be but not limited to audio loudspeaker for audio amplification. This invention utilises a primary power source which may be but not limited to 12 or 24 DC volts from automobile battery of Direct current derived directly from rectified and filtered 115 volts AC mains.

High frequency current pulses are applied directly from primary source through primary semiconductor switches on to primary winding of high frequency switching transformer. Primary and output switches which can be but not limited to field effect semiconductors operating in the ON-OFF mode whereby they are either fully conducting or fully turned off. Duty cycle of primary switches is controlled by aforementioned pulse width modulator. Power dissipation in these switches depends mainly on switching transition times and turn-on resistance of semiconductor junction. Also lower power drive is necessary to operate Field Effect Semiconductors. Faster transition time and lower junction resistance effect lower power dissipation and less heat being generated. Transition time is limited mainly by semiconductor design but not amplifier design accordingly, power wastage and heat dissipation is reduced in primary and output semiconductor switches.

The present invention utilises a high frequency switching transformer operating at but not limited to 500 Kilo Hertz or a minimum of three times the input frequency. At this relatively high frequency, very large magnetic pulse can be effected through a relatively small transformer core using low resistance conductor windings, high current pulses and a small number of conductor turns due to small inductances required for power conversion at this high frequency. Higher operating frequencies result in smaller transformer cores, lower number of conductor resistance.

Further, this size of power converter is reduced with subsequent reduction in heat and power dissipation. Limitations are only due to core material, conductor and semiconductor technology. Accordingly, the efficiency of the present invention is extremely high using single stage power conversion, high frequency power devices and switching technology to hereby reduce heat and power dissipation and further a significant reduction in size and weight is realized. With the advent of higher frequency transformer core material and superconductor technology, super efficient power converters can be realized using the present invention.

BRIEF DESCRIPTION OF THE DRAWINGS

For a fuller understanding of the present invention, reference should be made to the following detailed description taken in connection with the accompanying drawing in which.

DETAILED DESCRIPTION OF THE PREFERRED

Figure 1:
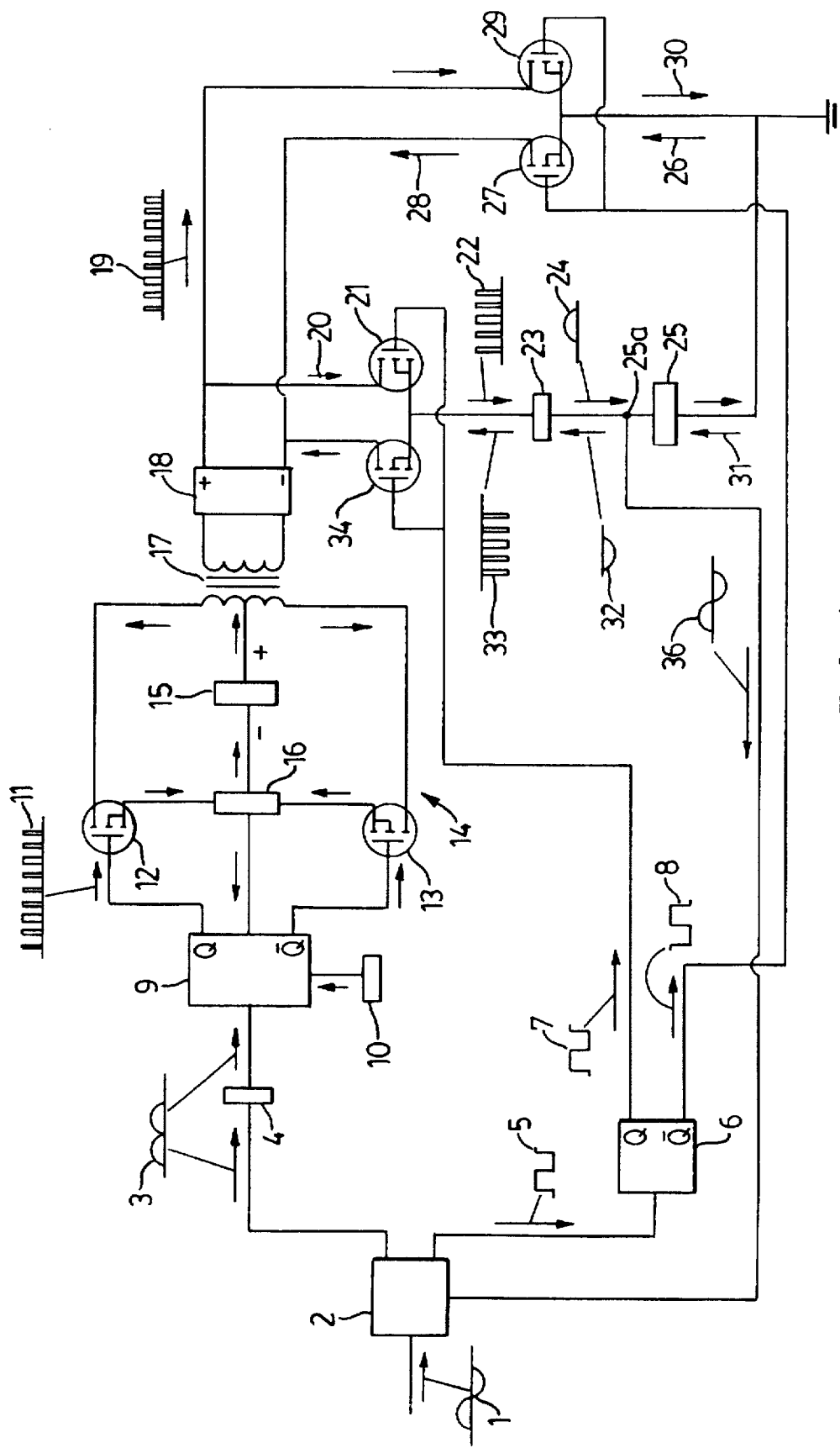
FIG. 1 is a schematic representation of the preferred embodiment of the present invention wherein a power source is pulse width modulated through a high frequency switching transformer for power amplification, as shown.

As shown, FIG. 1 a schematic representation of a preferred embodiment of the present invention, is represented wherein a portion of the system incorporating the subject electronic inductive switching power amplifier is generally represented as 14 and wherein signal path is indicated by directional arrows.

The portion of the present invention includes an electronic pulse width modulator circuitry 9, primary field effect semiconductor switches 12 and 13 and a high frequency switching transformer 17, having a centre-tapped primary winding. The subject inductive switching power amplifier also includes a primary power source 15, a current sensing circuit 16 and, further, a thermal sensing circuitry 10 monitors heat sink temperature of semiconductor switches and operates a thermal shutdown on pulse width modulator 9. Current sensor 16 monitors current through primary semiconductor switches 12 and 13 and operates a high current limit and subsequent shutdown of pulse width modulator 9 when excessive current is sensed.

The primary power source 15 is a direct current (DC) source such as 12 or 24 volts DC from automobiles or direct current such as 160 volts DC derived directly from rectified and filtered 115 volts alternating current (AC) main supply.

The present invention further includes a full wave rectifier 18 whose input is connected to said secondary winding of transformer 17 and whose output is a pulsating direct current pulse width modulated and represented by waveform 19. The subject inductive switching power amplifier further includes field effect semiconductor output switches 21, 27, 29 and 34 taking signal from rectifier 18 and alternately switching this signal across an electrical load such as a loudspeaker 25 through a low pass electronic filter 23.

Low pass filter 23 is used to filter pulse width modulated signals represented by waveforms 22 and 33 and to thereby recover output signals represented by waveforms 24 and 32.

The present invention also includes a multifunction preamplifier 2, an electronic signal isolator 4 and an output driver circuit 6, all being supplied with power from either a conventional mains operated direct current source such as 15 volts DC or 12 volts DC from automobile. For ease of understanding, a sinewave is used herein as the input waveform 1 shown in FIG. 1. The multifunction preamplifier 2 takes in the input signal, represented by waveform 1, and using a common ground reference produces an absolute value signal output represented by waveform 3, wherein the first half cycle is in phase with the positive half cycle of waveform 1 and the second half cycle of waveform 3 is 180 degrees out of phase with input waveform 1.

A second signal, which is a square wave represented by waveform 5, is produced by preamplifier 2 and is in phase with input waveform 1. Output Driver 6 receives waveform 5 as input signal and produces complimentary outputs represented by waveforms 7 and 8, capable of driving output field effect semiconductor switches 21 and 34 and 27 and 29 respectively. Signal isolator 4 is an electrical signal isolator such as an optical isolator or signal transformer which is used to isolate input and output circuitry from primary power source 15 when derived from AC mains. Isolator is not required when a mains isolated primary power source is used.

With reference to FIG. 1, input signal represented by waveform 1 is applied to multifunction preamplifier 2, thereby producing an absolute value of waveform 1, represented by waveform 3, as one output and a second output represented by waveform 5. Signal waveform 3 passes through isolator 4 and therein to pulse width modulator 9 operates at a minimum frequency of three times the input signal frequency and having complimentary outputs alternately turns on semiconductor switches 12 and 13 and thereby modulating primary power source 15 through primary winding on high frequency transformer 17.

The required power conversion and amplification is effected by means of primary to secondary winding ratio of transformer 17. Secondary winding on transformer 17 is connected to a full wave rectifier 18 whose output is a pulsating direct current (DC) represented by waveform 19.

For positive half cycle of waveform 1, the 'Q' output of output diver 6 goes positive, turning on switch 21 and turning off switch 34 whereas the 'Q' output of driver 6 goes negative turning on switch 27 and turning off switch 29. Pulse width modulated signal 19, from full wave rectifier 18 passes through semiconductor switch 21, shown by directional arrow 20, thereby goes through low pass filter 23 where it is converted to is a positive half sinewave represented by waveform 24 applied to power takeoff point 25-A and to loudspeaker 25 connected to ground. Signal return path is up as directional arrow 26 through switch 27 as directional arrow 28 thence to rectifier 18.

For negative half wave of input waveform 1, the 'Q' output of output driver 6 goes negative turning on switch 34 and turning off switch 21, whereas 'Q' output goes positive turning on switch 29 and turning off switch 27. Signal path can be further followed through switch 29 as arrow 30 and 31 through loudspeaker 25 through low pass filter 23 the switch 34 thence to rectifier 18.

Negative half waveform 32 is derived from modulated waveform 19 again through low pass filter 23. It can be seen therefore that a complete representation of input waveform 1 is reproduced at the output of low pass filter 23 at a greatly increased power level and connected to power takeoff point 25-A such as electrical terminals to operate an electrical load such as a loudspeaker 25 for audio reproduction.

Output signal represented as feedback waveform 36 is applied to multifunction preamplifier 2 to obtain required stability and linearity.

What is claimed as the invention is:

1. An Electronic Inductive Switching Power Amplifier in combination with a Direct current power source comprising,
   (a) An electronic pulse width modulator circuitry in electrical communication with primary semiconductor switches in further communication with a high frequency switching transformer;
   (b) A direct current primary power source electrically connected to the said pulse width modulator, further connected to primary winding on said high frequency switching transformer and to the said primary semiconductor switches through a current sensing circuit;
   (c) A thermal sensing circuit in thermal communication with the said semiconductor switches and electrically connected to shutdown said pulse width modulator when thermal limits are exceeded;
   (d) A multifunction preamplifier electrically connected to an input signal source and further connected to a direct current power source;
   (e) The said multifunction preamplifier providing two output signals, one connected to an electrical signal isolator and the second output connected to an output driver circuit;
   (f) Said signal isolator is electrically connected to input of said pulse width modulator;
   (g) A secondary winding on said high frequency switching transformer is in electrical communication with a full wave rectifier in further communication with output semiconductor switches;
   (h) An electronic low pass filter circuit connected to an electrical power take off point receiving signal from said output semiconductor switches and thereby connected;
   (i) Said output driver circuit producing complimentary outputs electrically operates said output semiconductor switches alternately switching signal from said power take off point through said low pass filter to further operate an electrical load; and
   (j) An electrical feedback signal from said power take off point connected to said multifunction preamplifier for further stability and linearity of signal amplification.

2. An electronic inductive switching power amplifier as in claim 1 wherein said multifunction preamplifier comprises an electronic circuit having a signal input point, a feedback input point and two output points, structured to amplify applied input signal, compute negative feedback and produce two input signals, one of which represents the absolute value of the said input signal suitable for operating said pulse width modulator through said signal isolator and the second signal which is a switching waveform in phase with said input waveform for electrically operating said output driver circuit.

3. An electronic inductive switching power amplifier as in claim 2 wherein said electrical signal isolator comprises an electronic device providing electrical isolation but otherwise couples between said absolute value signal and said pulse width modulator and thereby connected.

4. An electronic inductive switching power amplifier as in claim 3 wherein said pulse width modulator circuit comprises an electronic circuit operating at a minimum frequency of three times the said input signal frequency, takes in said absolute value signal and produces complimentary pulse width modulated outputs proportional to said input signal, further operating said primary semiconductor switches.

5. An electronic inductive switching power amplifier as in claim 4 wherein said thermal sensor circuit further includes a thermal sensor in thermal communication with said primary and output semiconductor switches and further provides shutdown of said pulse width modulator whenever thermal limits are exceeded.

6. An electronic inductive switching power amplifier as in claim 5 wherein said current sensor circuit further includes current sensor monitoring current through said primary semiconductor switches and further providing high current limiting and subsequent shutdown of said pulse width modulator when current limits are exceeded.

7. An electronic inductive switching power amplifier as in claim 6 wherein said primary semiconductor switches comprise semiconductor devices capable of switching high currents at high voltages and high frequencies and requiring small control signal from said pulse width modulator further taking power from said primary power source and modulating large currents through primary winding of said high frequency switching transformer.

8. An electronic inductive switching power amplifier as in claim 7 wherein said high frequency switching transformer comprises primary and secondary windings on a core material thereby capable of switching large current at high frequencies wherein said primary power source is pulse width modulated through said primary semiconductor switches through said primary winding transferring power to said secondary winding thereafter connected to said full wave rectifier.

9. An electronic inductive switching power amplifier as in claim 8 wherein said primary power source is a Direct current power source operating said pulse width modulator and associate circuitry and further includes a secondary direct current power source for operating said multifunction preamplifier, said output driver circuit and all associated circuitry.

10. An electronic inductive switching power amplifier as in claim 9 wherein said full wave rectifier comprises semiconductor devices structured to rectify high currents at high frequencies and at high voltages thereby converting alternating current output from said secondary winding of said high frequency switching transformer to a full wave pulsating direct current signal further connected to said output semiconductor switches.

11. An electronic inductive switching power amplifier as in claim 10 wherein said output semiconductor switches comprise semiconductor devices capable of switching high currents at high voltages and high frequencies requiring small electrical control signals from said output driver circuit and further connected to alternately switch said pulsating direct current signal to said power take off point through said low pass filter.

12. An electronic inductive switching power amplifier as in claim 11 wherein said low pass filter circuit comprises electronic components connected to recover low frequency signal from said pulse width modulator pulsating from said direct current power source and to further communicate recovered signal to power take off point wherein said Input signal waveform is reconstructed at a greatly increased power level for operating an electrical load.

13. An electronic inductive switching power amplifier as in claim 12 wherein said output driver circuit comprises an electronic circuit structured to take in said switching signal from said multifunction preamplifier and to further convert this signal to complementary output signals suitable for controlling said output semiconductor switches.

14. An electronic inductive switching power amplifier as in claim 13 wherein said feedback signal is taken from said power take off point and communicated to said multifunction preamplifier for providing further stability and linearity of said electronic inductive switching power amplifier.

15. An electronic inductive switching power amplifier as in claim 14 wherein said power take off point comprises electrical terminations taken at output of low pass filter with ground reference wherein said electrical load is connected.

\* \* \* \* \*

UNITED STATES PATENT OFFICE
CERTIFICATE OF CORRECTION

PATENT NO. : 5,781,067
DATED : July 14, 1998
INVENTOR(S) : Tasleem Tota

It is certified that error appears in the above-identified patent and that said Letters Patent is hereby corrected as shown below:

On the title page, item [76], delete "St. Kitts/Nevis" and insert --West Indies--.

Signed and Sealed this

Nineteenth Day of January, 1999

Attest:

Attesting Officer

*Acting Commissioner of Patents and Trademarks*